United States Patent
Wang et al.

(10) Patent No.: US 8,947,877 B2
(45) Date of Patent: Feb. 3, 2015

(54) EXPANDING DEVICE FOR PORTABLE ELECTRONIC APPARATUS

(71) Applicant: Wistron Corporation, New Taipei (TW)

(72) Inventors: Wei-Cheng Wang, New Taipei (TW); Hsin-Hao Chen, New Taipei (TW); Tsung-Ying Tsai, New Taipei (TW); Tzu-Wei Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 234 days.

(21) Appl. No.: 13/733,472

(22) Filed: Jan. 3, 2013

(65) Prior Publication Data

US 2013/0175909 A1    Jul. 11, 2013

(30) Foreign Application Priority Data

Jan. 6, 2012 (TW) ............................. 101100671 A

(51) Int. Cl.
- *G06F 1/16* (2006.01)
- *H05K 5/02* (2006.01)
- *G06F 3/02* (2006.01)

(52) U.S. Cl.
CPC ............ *H05K 5/0217* (2013.01); *G06F 1/1626* (2013.01); *G06F 1/1632* (2013.01); *G06F 1/1669* (2013.01); *G06F 1/1679* (2013.01); *G06F 3/0202* (2013.01)
USPC .............. 361/679.59; 361/679.17; 361/679.3; 361/679.58; 312/223.1; 312/223.2

(58) Field of Classification Search
CPC .... G06F 1/1624; G06F 1/1626; G06F 1/1628
USPC ......................................... 361/679.17, 679.59
See application file for complete search history.

(56) References Cited

U.S. PATENT DOCUMENTS

| | | | |
|---|---|---|---|
| 5,596,482 A * | 1/1997 | Horikoshi ................ | 361/679.59 |
| 5,737,183 A * | 4/1998 | Kobayashi et al. ...... | 361/679.58 |
| 6,418,010 B1 * | 7/2002 | Sawyer .................... | 361/679.05 |
| 6,532,148 B2 * | 3/2003 | Jenks et al. .............. | 361/679.56 |
| 6,757,159 B2 * | 6/2004 | Zarek et al. .............. | 361/679.09 |
| 6,781,819 B2 * | 8/2004 | Yang et al. ............... | 361/679.09 |
| 7,719,826 B1 * | 5/2010 | Chang et al. ............. | 361/679.17 |
| 8,089,758 B2 * | 1/2012 | Zhu et al. ................. | 361/679.58 |
| 8,172,282 B2 * | 5/2012 | Lev et al. ....................... | 292/164 |
| 8,792,236 B2 * | 7/2014 | Tomita et al. ............ | 361/679.56 |
| 2007/0103860 A1 * | 5/2007 | Lo et al. ........................ | 361/683 |
| 2010/0323770 A1 * | 12/2010 | Chuang et al. ............ | 455/575.4 |
| 2011/0136555 A1 * | 6/2011 | Ramies et al. ............ | 455/575.8 |
| 2013/0178161 A1 * | 7/2013 | Shulenberger ............ | 455/41.2 |
| 2014/0211108 A1 * | 7/2014 | Matsumoto et al. .......... | 349/12 |

* cited by examiner

*Primary Examiner* — Anthony Q Edwards
(74) *Attorney, Agent, or Firm* — Muncy, Geissler, Olds & Lowe, P.C.

(57) ABSTRACT

An expanding device for a portable electronic apparatus is disclosed. The expanding device includes a main body for placing the portable electronic apparatus and a sliding assembly disposed in the main body. The sliding assembly includes a slide track element disposed in the main body, a sliding element, and a cover. The sliding element is slidably coupled to the slide track element and slides between a receiving position and an extending position relative to the main body. The cover is pivotally connected to the sliding element and includes a fixing portion. When the sliding element is moved towards outside of the main body to the extending position, the cover can be rotated relative to the sliding element, and the portable electronic apparatus can be fixed on the main body via the fixing portion of the cover.

13 Claims, 7 Drawing Sheets

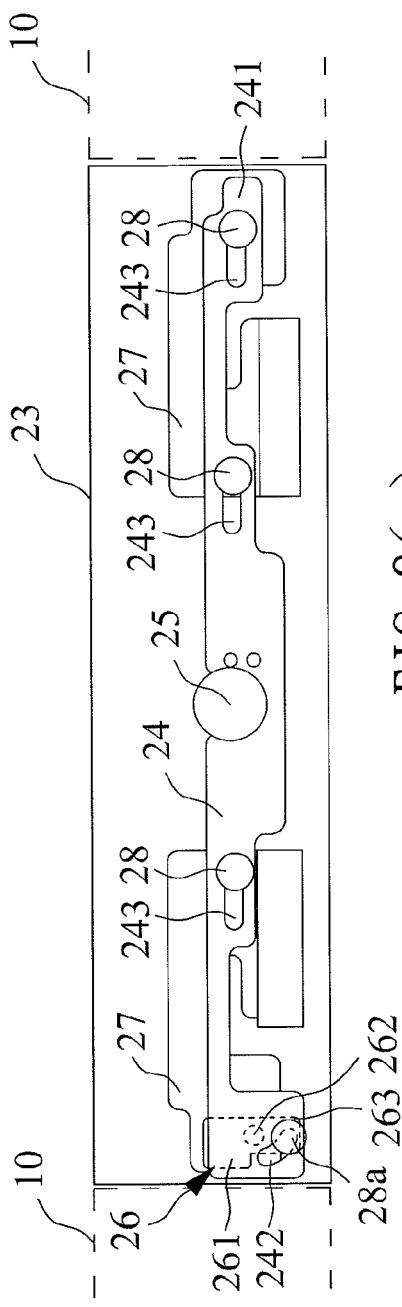
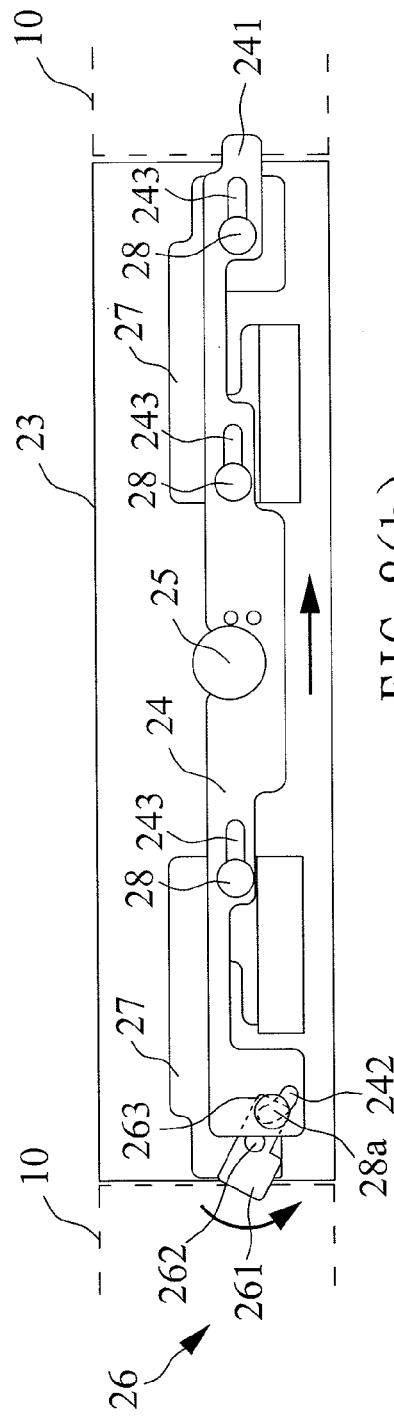

EXPANDING DEVICE FOR PORTABLE ELECTRONIC APPARATUS

BACKGROUND OF THE INVENTION

1. Field of the Invention

The present invention relates to an expanding device, and more particularly, to an expanding device for fixing a portable electronic apparatus in place.

2. Description of the Prior Art

In recent years, portable electronic apparatuses, such as tablet computers, are becoming more popular with the majority of the general public. Compared with notebook computers in general, tablet computers are not only more portable, but support touch input to enable users to operate tablet computers by intuition. Since tablet computers do not have a physical keyboard, users who are used to entering data into a notebook computer with a keyboard find themselves clumsy in manipulating tablet computers. Therefore, expanding device assemblies for use with tablet computers have been launched into the market. An expanding device assembly has a keyboard module. Referring to FIG. 1(a), a tablet computer 50 is positioned on an expanding device assembly 60 and electrically connected thereto, and the expanding device assembly 60 comprises a keyboard module 61, such that the tablet computer 50 and the expanding device assembly 60 work together in the same way as a notebook computer does, as a user enters data into the tablet computer 50 by means of the keyboard module 61. Referring to FIG. 1(b), when idle, the tablet computer 50 positioned on the expanding device assembly 60 is no longer upright but assumes a lie-flat posture, such that the tablet computer 50 and the expanding device assembly 60 together is compact whether lying idle or being carried.

However, according to the prior art, the recumbent tablet computer 50 is not actually fixed to the expanding device assembly 60. As a result, the recumbent tablet computer 50 is likely to fall off the expanding device assembly 60 and get damaged when handled by a careless user. For this reason, it is inconvenient for users to move or carry the tablet computer 50 and the expanding device assembly 60 together, because the users have to give extra care to the unfastened tablet computer 50.

Accordingly, it is imperative to provide a device for fixing a tablet computer in place.

SUMMARY OF THE INVENTION

It is an objective of the present invention to provide an expanding device for fixing a portable electronic apparatus in place.

In order to achieve the above and other objectives, the present invention provides an expanding device for a portable electronic apparatus. The expanding device comprises: a main body for placing a portable electronic apparatus; and a sliding assembly disposed in the main body, the sliding assembly comprising: a slide track element fixed to the main body; a sliding element is slidably coupled to the slide track element. The sliding element slides between a receiving position and an extending position relative to the main body; and a cover pivotally connected to the sliding element, the cover comprising a fixing portion. The cover rotates relative to the sliding element when the sliding element slides to the extending position, such that the portable electronic apparatus is fixed to the main body by the fixing portion of the cover.

In one embodiment of the present invention, the sliding assembly further comprises a lever element and an operation element connected to the lever element, and the cover further comprises a receiving slot, the lever element being slidably coupled to the cover; the operation element moves along the receiving slot to drive the lever element to a fastened position, thereby allowing the main body to be fixed to the cover by the lever element.

In one embodiment of the present invention, the lever element comprises a first fastening portion; the first fastening portion stops at the main body when the lever element reaches the fastened position while the portable electronic apparatus is fixed to the cover.

In one embodiment of the present invention, the sliding assembly further comprises a link structure. The link structure comprises a second fastening portion, a pivot portion, and a link portion. The pivot portion is positioned between the second fastening portion and the link portion. The link structure is rotatably connected to the cover by the pivot portion. The link portion is slidably connected to the lever element. Wen the portable electronic apparatus is fixed to the cover, the lever element slides to the fastened position and drive the link portion, such that the second fastening portion stops at the main body.

Accordingly, the expanding device of the present invention may fix the portable electronic apparatus lying on the main body to the sliding assembly. The portable electronic apparatus is less likely to fall off the main body by the lever element for fastening the cover in place. When idle, the sliding assembly may be accommodated inside the main body, such that the sliding assembly and the main body together look like a unitary structure, thereby enhancing the ease of use and esthetic appearance of the expanding device.

BRIEF DESCRIPTION OF THE DRAWINGS

Objectives, features, and advantages of the present invention are hereunder illustrated with specific embodiments in conjunction with the accompanying drawings, in which:

FIG. 8(a) is a schematic view of a lever element of the expanding device for a portable electronic apparatus according to the present invention at an initial position; and FIG. 8(b) is a schematic view of a lever element of the expanding device for a portable electronic apparatus according to the present invention at a fastened position.

DETAILED DESCRIPTION OF THE EMBODIMENTS

Figure 1A:
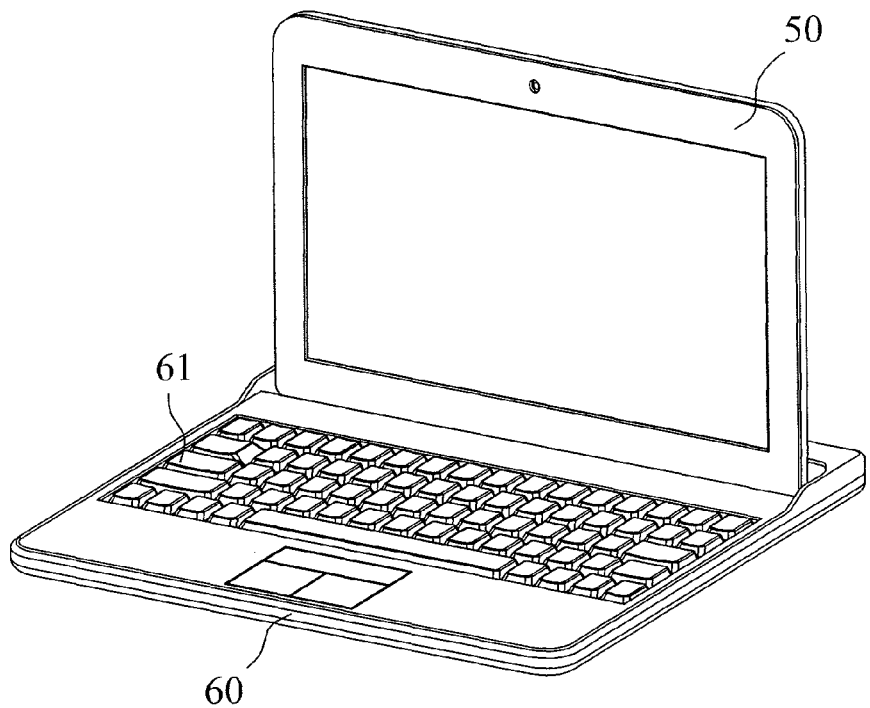
FIG. 1(a) (prior ART) is a schematic view of a conventional expanding device on which a tablet computer is positioned.
Figure 1B:
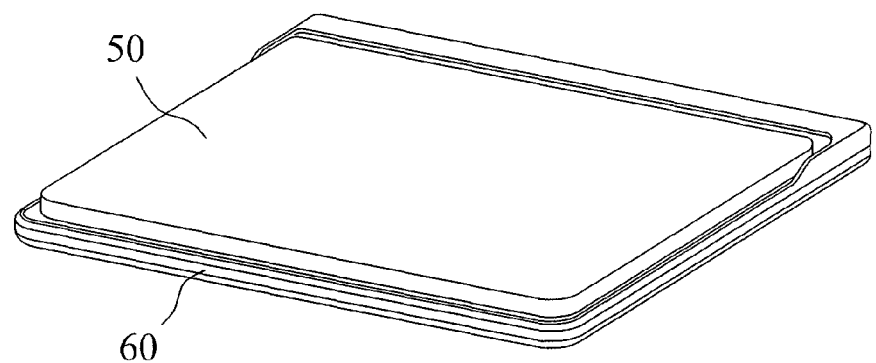
FIG. 1(b) (prior ART) is a schematic view of the conventional expanding device on which the tablet computer lies flatly.
Figure 2:
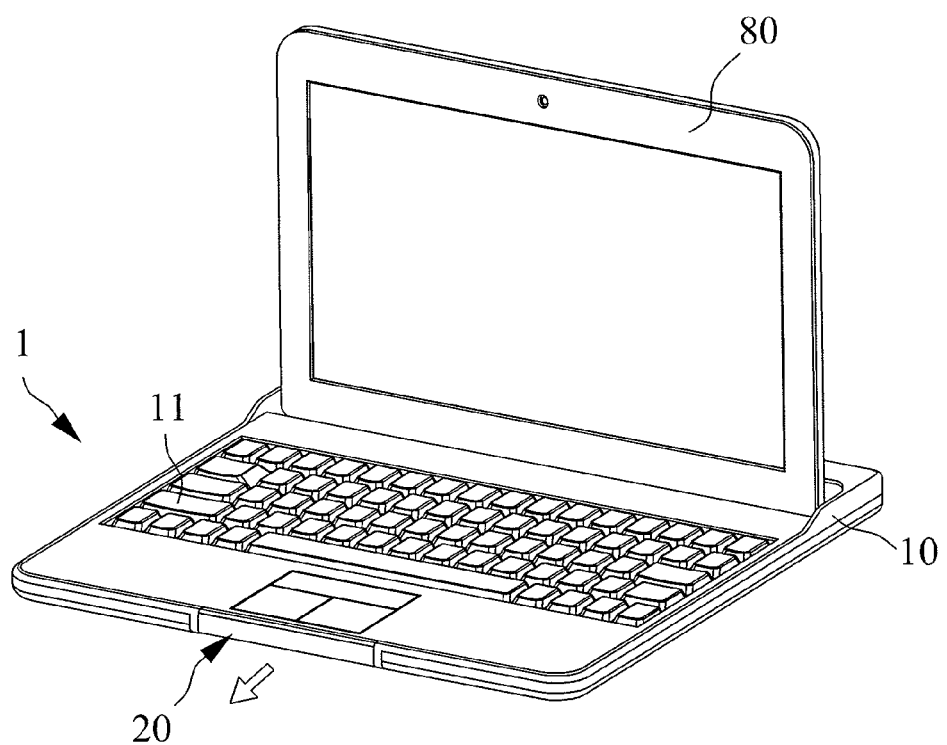
FIG. 2 is a schematic view of an expanding device for a portable electronic apparatus according to the present invention to position the portable electronic apparatus.

Referring to FIG. 2, there is shown a schematic view of an expanding device 1 for a portable electronic apparatus 80 according to the present invention to position the portable electronic apparatus 80. In one embodiment of the present invention, the portable electronic apparatus 80 is a tablet computer. However, this embodiment is illustrative rather than restrictive of the portable electronic apparatus 80, and thus the portable electronic apparatus 80 can be a smartphone or any related electronic device as needed.

Referring to FIG. 2, the expanding device 1 of the present invention comprises a main body 10 and a sliding assembly 20. The main body 10 enables the portable electronic apparatus 80 to be positioned on the expanding device 1. The main body 10 comprises a keyboard 11. When the portable electronic apparatus 80 needs to access the keyboard 11, the portable electronic apparatus 80 is positioned substantially upright or oblique on the main body 10. When the portable electronic apparatus 80 need not access the keyboard 11, the portable electronic apparatus 80 is positioned substantially horizontal on the main body 10. The sliding assembly 20 is disposed in the main body 10. In general, the sliding assembly 20 is accommodated inside the main body 10 as shown in FIG. 2, such that the sliding assembly 20 and the main body 10 together look like a unitary structure, but the present invention is not limited thereto. To access the sliding assembly 20, a user pulls the sliding assembly 20 in the direction indicated by the arrow shown in FIG. 2.

Figure 3:
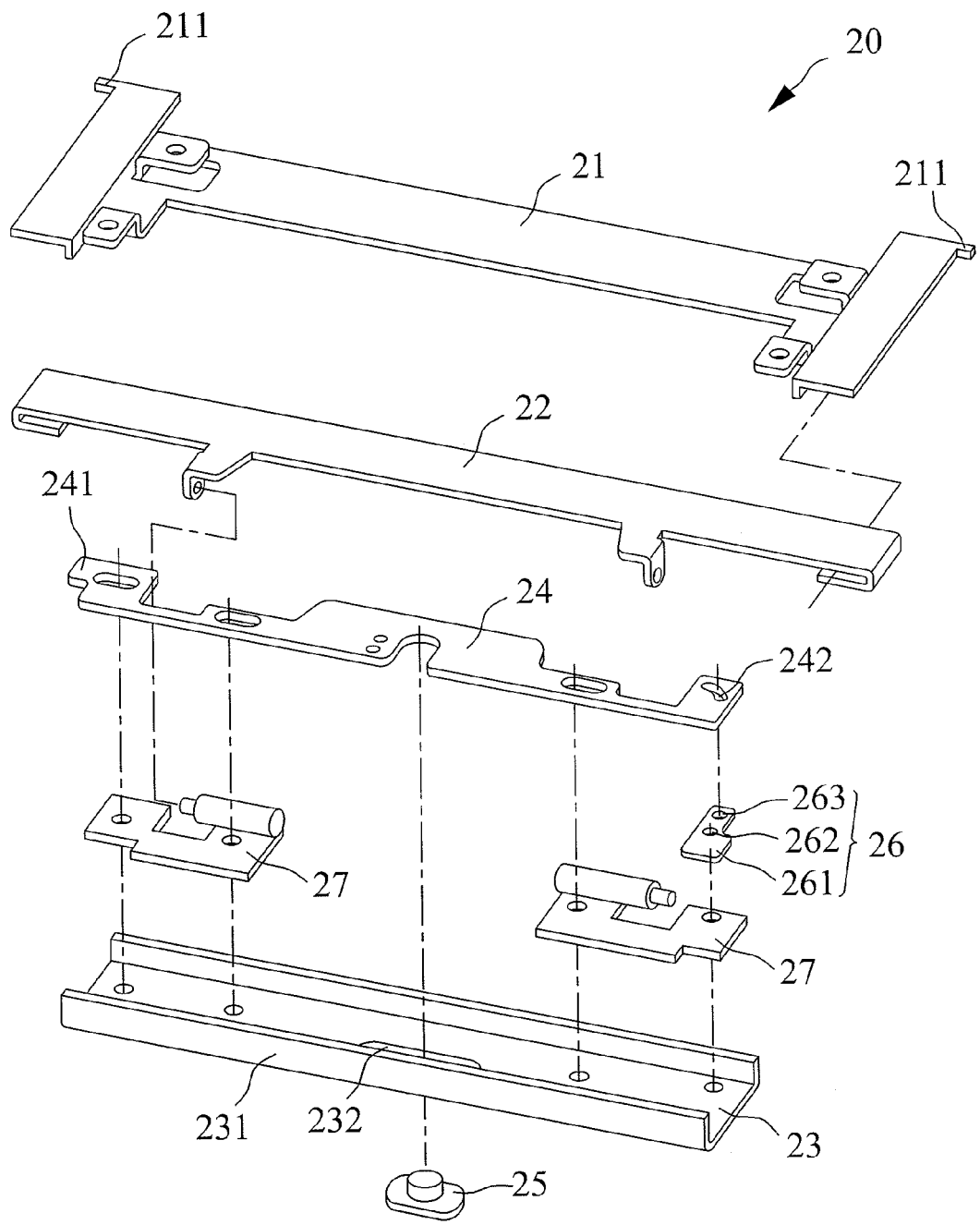
FIG. 3 is an exploded view of a sliding assembly of the expanding device for a portable electronic apparatus according to the present invention.

Referring to FIG. 3, there is shown an exploded view of the sliding assembly 20 of the expanding device 1 for a portable electronic apparatus according to the present invention. As shown in FIG. 3, the sliding assembly 20 of the expanding device 1 comprises a slide track element 21, a sliding element 22, and a cover 23. The slide track element 21 is fixed to the main body (not shown). The sliding element 22 is slidably coupled to the slide track element 21 to slide between a receiving position and an extending position relative to the main body. The slide track element 21 comprises at least one stop portion 211 for providing a sliding limit of the sliding element 22. In one embodiment of the present invention, the at least one stop portion 211 is disposed at the rear end of the slide track element 21 to ensure that the sliding element 22 can slide back only as far as the receiving position, thereby preventing the sliding element 22 from separating from the slide track element 21, but the present invention is not limited thereto. Alternatively, the at least one stop portion 211 is disposed at front end of the slide track element 21 to ensure that the sliding element 22 can slide forward only as far as the extending position, thereby preventing the sliding element 22 from separating from the slide track element 21.

The cover 23 is pivotally connected to the sliding element 22, and thus the cover 23 can rotate relative to the sliding element 22. In one embodiment of the present invention, the sliding assembly 20 further comprises at least one axial rotation element 27. Each axial rotation element 27 is fixed to the cover 23. The cover 23 is pivotally connected to the sliding element 22 by the at least one axial rotation element 27, but the present invention is not limited thereto. Alternatively, the cover 23 is equipped with a pivot portion and thereby pivotally connected to the sliding element 22. The aforesaid axial rotation element is capable of automatic locking. That is to say, once the aforesaid axial rotation element rotates to the vicinity of a preset angle (for example, 90 degrees), the axial rotation element will automatically rotate to the preset angle and thereby give the user a sense of positioning, but the present invention is not limited thereto. Alternatively, the aforesaid axial rotation element is a conventional one. The cover 23 comprises a fixing portion 231 whereby a portable electronic apparatus positioned on the main body is fixed in place.

The sliding assembly 20 further comprises a lever element 24 and an operation element 25 connected to the lever element 24. The cover 23 further comprises a receiving slot 232. The lever element 24 is slidably coupled to the cover 23, and thus the lever element 24 may slide relative to the cover 23. According to the aforesaid embodiment, with the cover 23 being coupled to the at least one axial rotation element 27, the lever element 24 may be slidably coupled to the at least one axial rotation element 27 to thereby achieve the aforesaid effect of sliding relative to the cover 23. The operation element 25 moves along the receiving slot 232 to drive the lever element 24 to slide between an initial position and a fastened position. The length of the lever element 24 is less than or equal to the length of the cover 23. The lever element 24 comprises a first fastening portion 241 disposed at an end of the lever element 24.

The sliding assembly 20 further comprises a link structure 26. The link structure 26 comprises a second fastening portion 261, a pivot portion 262, and a link portion 263. The pivot portion 262 is disposed between the second fastening portion 261 and the link portion 263. The link structure 26 is rotatably connected to the cover 23 by the pivot portion 262. The link portion 263 is slidably connected to the lever element 24. The lever element 24 further comprises a curved slot 242. The link portion 263 moves along the curved slot 242, such that the lever element 24 slides and drives the link structure 26 to rotate. The curved slot 242 of the lever element 24 is at another end opposite to the end at which the first fastening portion 241 of the lever element 24 is. It should be noted that the design of the link structure 26 represents just one embodiment aspect of the present invention. Alternatively, the link structure 26 is replaceable by a combination of other components having the same operation characteristics. For example, a gear and a rack which correspond in position to each other, or a connecting rod structure composed of multiple rod elements, but the present invention is not limited to this embodiment.

Figure 4A:
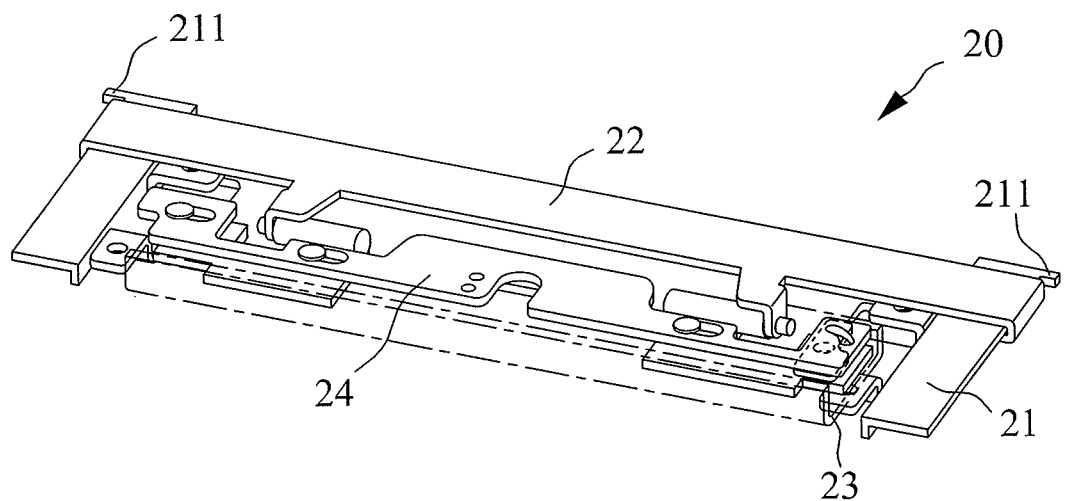
FIG. 4(a) is a schematic view of the sliding assembly of the expanding device for a portable electronic apparatus according to the present invention at a receiving position.
Figure 4B:
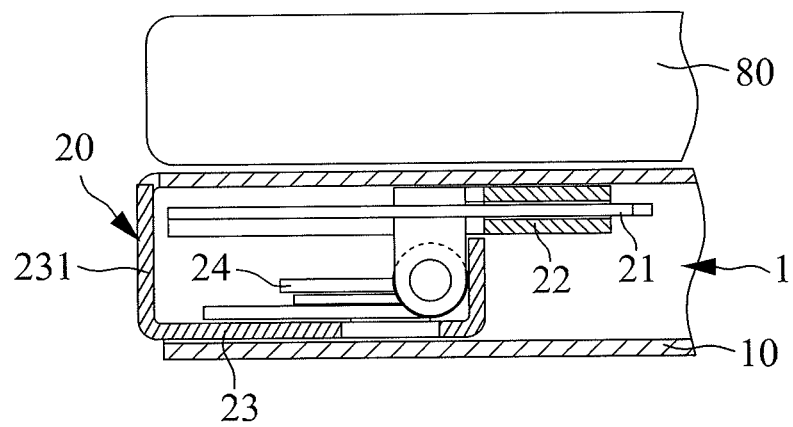
FIG. 4(b) is a cross-sectional view of the sliding assembly of the expanding device for a portable electronic apparatus according to the present invention at the receiving position.

Referring to FIG. 4(a) and FIG. 4(b). FIG. 4(a) is a schematic view of the sliding assembly 20 of the expanding device 1 for a portable electronic apparatus according to the present invention at the receiving position, and FIG. 4(b) is a cross-sectional view of the sliding assembly 20 of the expanding device 1 for a portable electronic apparatus according to the present invention at the receiving position.

As shown in FIG. 4(a) and FIG. 4(b), normally, the sliding assembly 20 of the expanding device 1 for a portable electronic apparatus has the sliding element 22 positioned at the receiving position at the rear end of the slide track element 21, and the at least one stop portion 211 prevents the sliding element 22 from sliding toward the rear end of the slide track element 21; meanwhile, the sliding element 22, the lever element 24, and the most of the cover 23 are accommodated in the main body 10, whereas the outer surface of the fixing portion 231 of the cover 23 and the outer surface of the main body 10 together look like a unitary structure. The portable electronic apparatus 80 is superimposed on the main body 10.

Figure 5A:
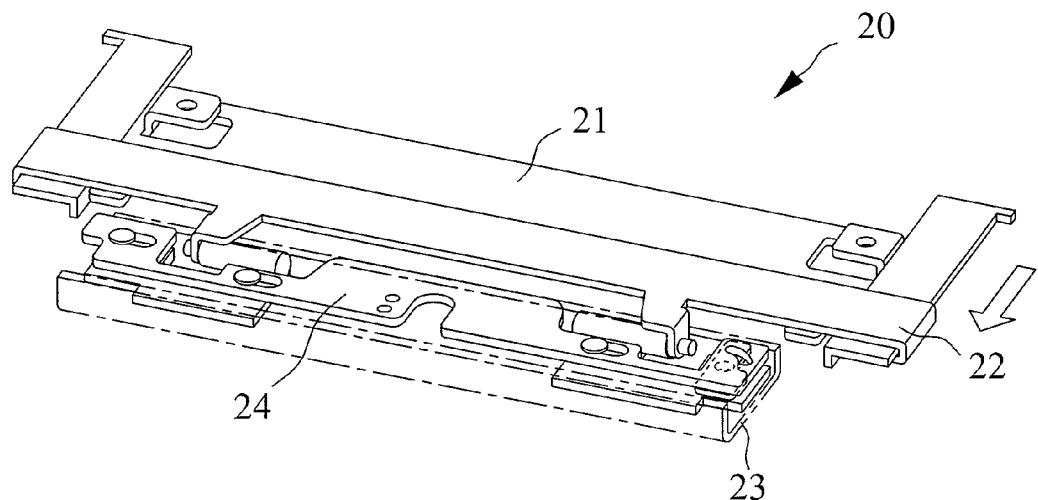
FIG. 5(a) is a schematic view of the sliding assembly of the expanding device for a portable electronic apparatus according to the present invention at an extending position.
Figure 5B:
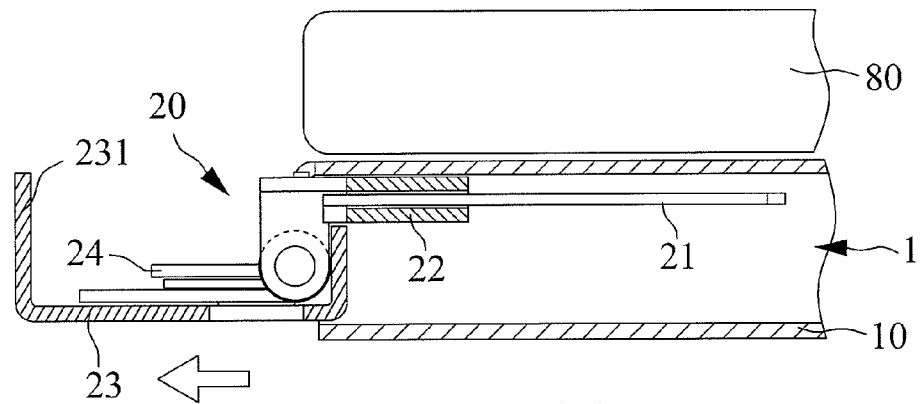
FIG. 5(b) is a cross-sectional view of the sliding assembly of the expanding device for a portable electronic apparatus according to the present invention at the extending position.

Referring to FIG. 5(a) and FIG. 5(b). FIG. 5(a) is a schematic view of the sliding assembly 20 of the expanding device 1 for a portable electronic apparatus according to the present invention at the extending position, and FIG. 5(b) is a cross-sectional view of the sliding assembly 20 of the expanding device 1 for a portable electronic apparatus according to the present invention at the extending position.

As shown in FIG. 5(a) and FIG. 5(b), to fix the portable electronic apparatus 80 in place, the user pulls the sliding assembly 20 in the direction indicated by the arrow in FIG. 5(a), such that the sliding element 22 slides toward the front end of the slide track element 21 relative to the main body 10. As a result, the sliding element 22 slides from the receiving position to the extending position and drives the cover 23 and the lever element 24 to move in a direction away from the main body 10 until the fixing portion 231 of the cover 23 and the other portion of the cover 23 substantially protrude from the main body 10, thereby allowing the user to rotate the cover 23 later.

Figure 6:
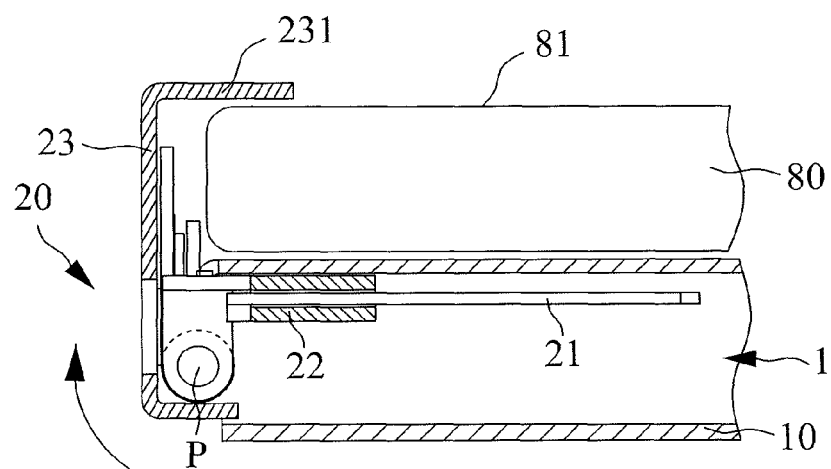
FIG. 6 is a cross-sectional view of the expanding device for a portable electronic apparatus according to the present invention to fix the portable electronic apparatus to a cover.

Referring to FIG. 6, there is shown is a cross-sectional view of the expanding device 1 for a portable electronic apparatus according to the present invention to fix the portable electronic apparatus 80 to the cover 23.

As shown in FIG. 6, once the sliding element 22 slides and reaches the extending position, the cover 23 may be rotated by 90 degrees approximately relative to the sliding element 22. The portable electronic apparatus 80 will be fixed to the main body 10 by means of the fixing portion 231 of the cover 23. It is because the distance from the pivot point P of the cover 23 and the sliding element 22 to the fixing portion 231 is larger than or equal to the distance from the pivot point P of the cover 23 and the sliding element 22 to a top side 81 of the portable electronic apparatus 80.

Figure 7:
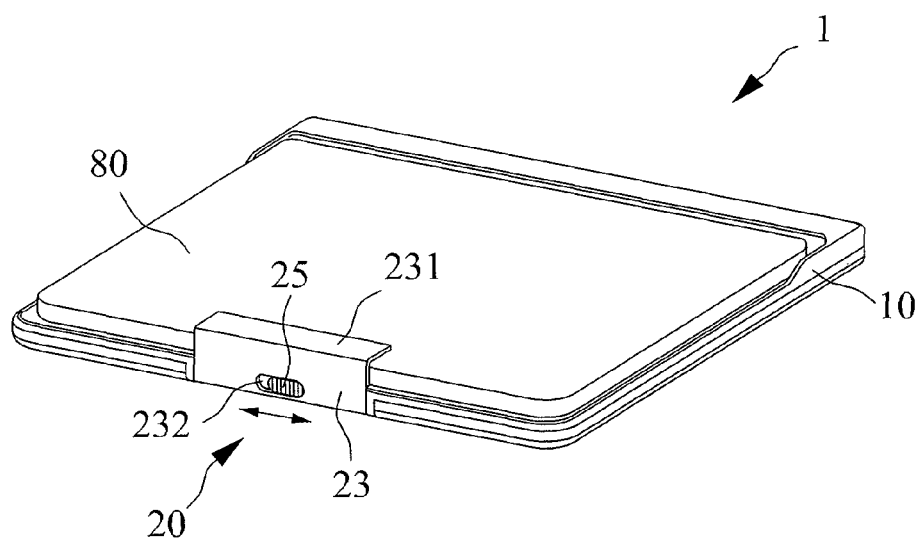
FIG. 7 is a schematic view of the expanding device for a portable electronic apparatus according to the present invention to fix the portable electronic apparatus to the cover.

Referring to FIG. 7, there is shown a schematic view of the expanding device 1 for a portable electronic apparatus according to the present invention to fix the portable electronic apparatus 80 to the cover 23.

As shown in FIG. 7, to fix the portable electronic apparatus 80 to the main body 10 by means of the fixing portion 231 of the cover 23, it is necessary that the fixing portion 231 of the cover 23 is prevented from separating from the portable electronic apparatus 80 because of inappropriate operation or under an external force. By the operation element 25 moving along the receiving slot 232 of the cover 23, the lever element (not shown) connected to the operation element 25 may be driven to move between the initial position and the fastened position, thus providing a fastening effect between the cover 23 and the main body 10.

Referring to FIG. 8(a) and FIG. 8(b). FIG. 8(a) is a schematic view of the lever element 24 of the expanding device for a portable electronic apparatus according to the present invention at the initial position, and FIG. 8(b) is a schematic view of the lever element 24 of the expanding device for a portable electronic apparatus according to the present invention at the fastened position.

As shown in FIG. 8(a), in the situation where the lever element 24 lies at the initial position, since the length of the lever element 24 is less than or equal to the length of the cover 23, the lever element 24 does not go beyond the cover 23 to affect the rotation of the cover 23. The lever element 24 is connected to the operation element 25 and thus moves together therewith. The lever element 24 further comprises a plurality of sliding slots 243 which are movably engaged with a plurality of fixing elements 28, respectively, such that the lever element 24 is slidably connected to the at least one axial rotation element 27 coupled to the cover 23. The curved slot 242 of the lever element 24 is connected to the link portion 263 of the link structure 26 by means of another fixing element 28a.

As shown in FIG. 7 and FIG. 8(b), in the situation where the portable electronic apparatus 80 is fixed to means of the cover 23, with the operation element 25 driving the lever element 24 to slide in the direction indicated by the arrow in FIG. 8(b), the first fastening portion 241 of the lever element 24 protrudes from one side of the cover 23 gradually until the lever element 24 reaches the fastened position, such that the first fastening portion 241 stops at the main body 10 to allow the cover 23 to fasten the main body 10 in place.

With the lever element 24 moving, the link portion 263 of the link structure 26 may be driven to move along the curved slot 242 by the design of the fixing element 28a and the curved slot 242, and the link structure 26 may be rotated about the pivot portion 262 anticlockwise. As a result, the second fastening portion 261 protrudes from the other side of the cover 23 gradually until the lever element 24 reaches the fastened position, such that the second fastening portion 261 stops at the other side of the main body 10 to allow the cover 23 to fasten the main body 10 in place.

Conversely, once the operation element 25 drives the lever element 24 to slide in a direction opposite to the direction indicated by the arrow in FIG. 8(b), the lever element 24 may move from the fastened position of FIG. 8(b) to the initial position of FIG. 8(a) gradually; meanwhile, the first fastening portion 241 of the lever element 24 and the second fastening portion 261 of the link structure 26 may return to their initial positions within the boundary of the cover 23, such that the cover 23 may rotate freely again to thereby attain the unlocking effect.

Due to the design of the present invention, the expanding device for a portable electronic apparatus enables the portable electronic apparatus to be fixed in place and provides the convenience of carrying the portable electronic apparatus and the expanding device together.

Although the present invention has been explained in relation to its preferred embodiments, it is to be understood that many other possible modifications and variations can be made without departing from the spirit and scope of the invention as hereinafter claimed.

What is claimed is:

1. An expanding device for a portable electronic apparatus, comprising:
   a main body for placing a portable electronic apparatus; and
   a sliding assembly disposed in the main body, the sliding assembly comprising:
   a slide track element fixed to the main body;
   a sliding element slidably coupled to the slide track element, the sliding element sliding between a receiving position and an extending position relative to the main body; and
   a cover pivotally connected to the sliding element, the cover comprising a fixing portion,
   wherein the cover rotates relative to the sliding element when the sliding element slides to the extending position, such that the portable electronic apparatus is fixed to the main body by the fixing portion of the cover.

2. The expanding device for a portable electronic apparatus as claimed in claim 1, wherein the slide track element comprises at least one stop portion for providing a sliding limit of the sliding element.

3. The expanding device for a portable electronic apparatus as claimed in claim 1, wherein the sliding assembly further comprises a lever element and an operation element connected to the lever element, and the cover further comprises a receiving slot, the lever element being slidably coupled to the cover; the operation element moves along the receiving slot to drive the lever element to a fastened position, thereby allowing the main body to be fixed to the cover by the lever element.

4. The expanding device for a portable electronic apparatus as claimed in claim 3, wherein the lever element comprises a first fastening portion; the first fastening portion stops at the main body when the lever element reaches the fastened position while the portable electronic apparatus is fixed to the cover.

5. The expanding device for a portable electronic apparatus as claimed in claim 4, wherein the sliding assembly further comprises a link structure, the link structure comprising a second fastening portion, a pivot portion, and a link portion, the pivot portion being disposed between the second fastening portion and the link portion, the link structure being rotatably connected to the cover by the pivot portion, the link portion being slidably connected to the lever element; when the portable electronic apparatus is fixed to the cover, the lever element slides to the fastened position and drive the link portion, such that the second fastening portion stops at the main body.

6. The expanding device for a portable electronic apparatus as claimed in claim 5, wherein the lever element further comprises a curved slot; the link portion moves along the curved slot when the lever element moves, such that the link structure rotates.

7. The expanding device for a portable electronic apparatus as claimed in claim 3, wherein the sliding assembly further comprises a link structure, the link structure comprising a second fastening portion, a pivot portion, and a link portion, the pivot portion being disposed between the second fastening portion and the link portion, the link structure being rotatably connected to the cover by the pivot portion, the link portion being slidably connected to the lever element; once the portable electronic apparatus is fixed to the cover, the lever element slides to the fastened position and drives the link portion to move, such that the second fastening portion stops at the main body.

8. The expanding device for a portable electronic apparatus as claimed in claim 7, wherein the lever element further comprises a curved slot; the link portion moves along the curved slot when the lever element moves, such that the link structure rotates.

9. The expanding device for a portable electronic apparatus as claimed in claim 3, wherein a length of the lever element is less than or equal to a length of the cover.

10. The expanding device for a portable electronic apparatus as claimed in claim 1, wherein the sliding assembly is accommodated in the main body when the sliding element reaches the receiving position.

11. The expanding device for a portable electronic apparatus as claimed in claim 1, further comprising at least one axial rotation element fixed to the cover, and the cover is pivotally connected to the sliding element by the at least one axial rotation element.

12. The expanding device for a portable electronic apparatus as claimed in claim 11, wherein a distance from a pivot point of the cover and the sliding element to the fixing portion is larger than or equal to a distance from the pivot point of the cover and the sliding element to a top side of the portable electronic apparatus.

13. The expanding device for a portable electronic apparatus as claimed in claim 1, wherein a distance from a pivot point of the cover and the sliding element to the fixing portion is larger than or equal to a distance from the pivot point of the cover and the sliding element to a top side of the portable electronic apparatus.

* * * * *